(12) United States Patent
Min

(10) Patent No.: US 11,581,510 B2
(45) Date of Patent: Feb. 14, 2023

(54) DISPLAY DEVICE HAVING A GLASS SUBSTRATE AND METHOD OF MANUFACTURE

(71) Applicant: Samsung Display Co., Ltd., Yongin-Si (KR)

(72) Inventor: Myoungan Min, Cheonan-si (KR)

(73) Assignee: SAMSUNG DISPLAY CO., LTD., Yongin-Si (KR)

( * ) Notice: Subject to any disclaimer, the term of this patent is extended or adjusted under 35 U.S.C. 154(b) by 111 days.

(21) Appl. No.: 16/991,211

(22) Filed: Aug. 12, 2020

(65) Prior Publication Data

US 2021/0135158 A1 May 6, 2021

(30) Foreign Application Priority Data

Oct. 31, 2019 (KR) .......................... 10-2019-0137416

(51) Int. Cl.
*H01L 51/00* (2006.01)
*H01L 51/50* (2006.01)
(Continued)

(52) U.S. Cl.
CPC ........ *H01L 51/5253* (2013.01); *C03C 21/002* (2013.01); *G02F 1/133305* (2013.01); *G09G 2330/04* (2013.01); *G09G 2330/045* (2013.01); *H01L 27/14678* (2013.01); *H01L 27/323* (2013.01); *H01L 27/3246* (2013.01); *H01L 51/502* (2013.01); *H01L 51/529* (2013.01); *H01L 2251/301* (2013.01)

(58) Field of Classification Search
CPC ............. H01L 51/5253; H01L 51/0096; H01L 51/0097; H01L 51/502; H01L 51/529; H01L 2251/5338; H01L 2251/558; H01L 2251/301; H01L 27/323; H01L 27/14678; H01L 27/3246; H01L 27/3295; G02F 1/133305; G06F 1/1641; G06F 1/1652; G09F 9/301; G09G 2330/04; G09G 2330/045

See application file for complete search history.

(56) References Cited

U.S. PATENT DOCUMENTS 9,303,842 B2 4/2016 Cheon
10,303,218 B2 * 5/2019 Jones .................... H05K 1/0306
(Continued)

FOREIGN PATENT DOCUMENTS

KR 10-2017-0033208 3/2017

*Primary Examiner* — Ida M Soward
(74) *Attorney, Agent, or Firm* — F. Chau & Associates, LLC

(57) ABSTRACT

A display device includes a display module having a folding area and a non-folding area adjacent to the folding area. A glass substrate is disposed on the display module and comprises a first layer and a second layer disposed on the first layer. The second layer has a compressive strength that is higher than a compressive strength of the first layer. The first layer and the second layer of the glass substrate each include a folding portion overlapping the folding area and having a first thickness and a non-folding portion overlapping the non-folding area and having a second thickness greater than the first thickness. The second layer of the non-folding portion has a thickness that is greater than a thickness of the second layer of the folding portion.

13 Claims, 9 Drawing Sheets

(51) Int. Cl.
*H01L 51/52* (2006.01)
*H01L 27/32* (2006.01)
*H01L 27/14* (2006.01)
*G02F 1/13* (2006.01)
*G06F 1/16* (2006.01)
*G09F 9/30* (2006.01)
*C03C 21/00* (2006.01)
G02F 1/1333 (2006.01)
H01L 27/146 (2006.01)

(56) References Cited

U.S. PATENT DOCUMENTS

| | | |
|---|---|---|
| 2014/0029212 A1 | 1/2014 | Hwang et al. |
| 2017/0341970 A1* | 11/2017 | Ishida ............... B32B 17/10889 |
| 2018/0046220 A1* | 2/2018 | Kim ........................ H01L 27/32 |
| 2018/0132371 A1* | 5/2018 | Yeum ................... H05K 5/0017 |
| 2018/0136758 A1* | 5/2018 | Kim ......................... G06F 3/044 |
| 2020/0287161 A1* | 9/2020 | Kim ..................... H01L 51/5253 |
| 2021/0031493 A1* | 2/2021 | Benjamin ......... B32B 17/10743 |
| 2021/0108077 A1* | 4/2021 | Berleue ................... C08L 83/16 |
| 2021/0399257 A1* | 12/2021 | Hwang ............... H01L 51/5284 |

* cited by examiner

DISPLAY DEVICE HAVING A GLASS SUBSTRATE AND METHOD OF MANUFACTURE

CROSS-REFERENCE TO RELATED APPLICATION

This application claims priority under 35 U.S.C. § 119 to Korean Patent Application No. 10-2019-0137416, filed on Oct. 31, 2019 in the Korean Intellectual Property Office, the disclosure of which is incorporated by reference in its entirety herein.

1. TECHNICAL FIELD

The present inventive concepts relate to a glass substrate, a method of manufacturing the glass substrate, and a display device including the glass substrate. More particularly, the present inventive concepts relate to a glass substrate having improved durability against impact, a method of manufacturing the glass substrate, and a display device including the glass substrate.

2. DISCUSSION OF RELATED ART

Glass substrates are included in a variety of electronic devices, such as a liquid crystal displays, plasma display panels, and organic light emitting displays. For example, the glass substrate may be used as a substrate for a display panel of a television set, a computer monitor, or a mobile terminal or as a cover glass to protect the display panel of the electronic devices.

SUMMARY

Exemplary embodiments of the present inventive concepts provides a glass substrate having improved durability.

Exemplary embodiments of the present inventive concepts provide a method of manufacturing the glass substrate having improved durability.

Exemplary embodiments of the present inventive concepts provide a display device including the glass substrate having improved durability.

According to an exemplary embodiment of the present inventive concepts, a display device includes a display module comprising a folding area and a non-folding area adjacent to the folding area. A glass substrate is disposed on the display module and comprises a first layer and a second layer disposed on the first layer. The second layer has a compressive strength that is higher than a compressive strength of the first layer. The first layer and the second layer of the glass substrate each include a folding portion overlapping the folding area and having a first thickness and a non-folding portion overlapping the non-folding area and having a second thickness greater than the first thickness. The second layer of the non-folding portion has a thickness that is greater than a thickness of the second layer of the folding portion.

The first thickness is equal to or greater than about 10 micrometers and equal to or smaller than about 50 micrometers.

The second thickness is equal to or greater than about 40 micrometers and equal to or smaller than about 100 micrometers.

The first layer includes a first alkali metal cation, and the second layer includes a second alkali metal cation having an ionic radius greater than an ionic radius of the first alkali metal cation.

The thickness of the second layer of the first portion is equal to or greater than about 0.2 times and equal to or smaller than about 0.5 times the thickness of the second layer of the second portion.

Each of the thickness of the second layer of the first portion and the thickness of the second layer of the second portion is uniform.

The first layer has an integral shape with the second layer.

The compressive strength of the second layer has a value decreasing as a distance from the first layer decreases.

The second layer covers the first layer.

The glass substrate includes a first surface disposed adjacent to the display module and provided with a concave portion defined therein to overlap the folding area and a second surface exposed to an outside and being flat, and the first surface is connected to the second surface by a third surface.

The display module includes a display element layer, a thin film encapsulation layer encapsulating the display element layer, and an input sensing layer disposed directly on the thin film encapsulation layer.

According to an exemplary embodiment of the present inventive concepts, a glass substrate includes a folding portion having a first thickness and a non-folding portion disposed adjacent to the folding portion and having a second thickness that is greater than the first thickness. The folding portion and the non-folding portion include a first layer and a second layer surrounding the first layer. The second layer has a compressive strength that is greater than the first layer. A thickness of the second layer of the non-folding portion is greater than a thickness of the second layer of the folding portion. The second thickness is in a range of about 40 micrometers to about 100 micrometers.

The first layer includes a first alkali metal cation, and the second layer includes a second alkali metal cation having an ionic radius greater than an ionic radius of the first alkali metal cation.

According to an exemplary embodiment of the present inventive concepts, a method of manufacturing a display device includes the step of providing a base glass substrate having a first portion and a second portion disposed adjacent to the first portion and having a thickness that is greater than a thickness of the first portion. A first chemical reinforcement process of the base glass substrate and a second chemical reinforcement process of the base glass substrate are performed. The first chemical reinforcement process and the second chemical reinforcement process are performed in any order. The first chemical reinforcement process includes a chemical reinforcement of the second portion of the base glass substrate. The second chemical reinforcement process includes a chemical reinforcement of both the first portion and the second portion of the base glass substrate.

The thickness of the second portion is equal to or greater than about 40 micrometers and equal to or smaller than about 100 micrometers.

The base glass substrate includes a first alkali metal cation. Each of the first chemical reinforcing and the second chemical reinforcing includes replacing the first alkali metal cation of the base glass substrate with a second alkali metal cation having an ionic radius greater than an ionic radius of the first alkali metal cation.

The replacing of the first alkali metal cation of the base glass substrate with a second alkali metal cation includes providing a solution in which the second alkali metal cation is dissolved to a surface of the base glass substrate and heating the solution in which the second alkali metal cation is dissolved at a temperature equal to or greater than about 350° C. or equal to or smaller than about 500° C.

The second alkali metal cation includes at least one of $Na^+$, $K^+$, $Rb^+$, and $Cs^+$.

The reinforcing of the second portion includes covering the first portion with a heat resistant member, providing an alkali metal cation to the second portion, and removing the heat resistant member.

The heat resistant member is a heat resistant tape.

According to the above, the glass substrate may have the improved durability.

According to the above, since the manufacturing method of the glass substrate includes two reinforcing operations, the glass substrate having the improved durability may be manufactured.

According to above, the display device may have the improved durability.

BRIEF DESCRIPTION OF THE DRAWINGS

The above and other advantages of the present inventive concepts will become readily apparent by reference to the following detailed description when considered in conjunction with the accompanying drawings wherein.

DETAILED DESCRIPTION OF EXEMPLARY EMBODIMENTS

Figure 1A:
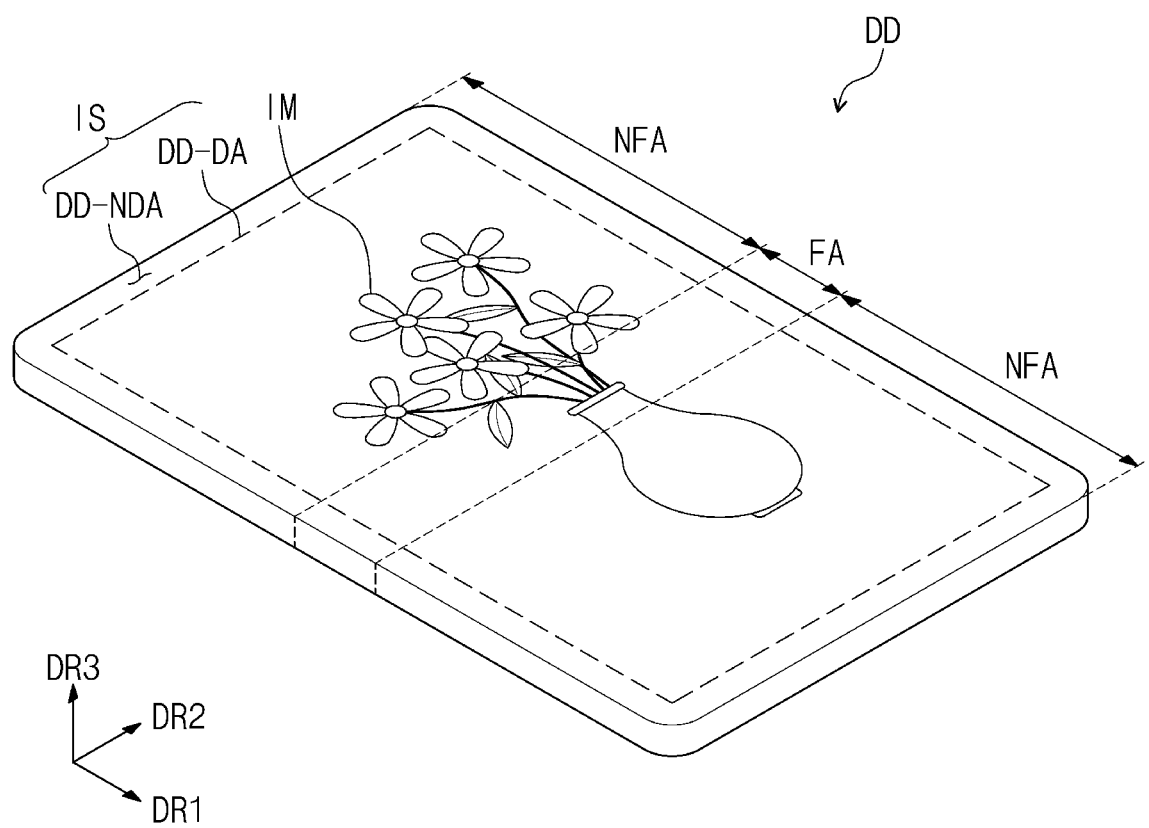
FIG. 1A is a perspective view showing a display device in a first operation according to an exemplary embodiment of the present inventive concepts.

In the following descriptions, it will be understood that when an element or layer is referred to as being "on", "connected to" or "coupled to" another element or layer, it can be directly on, connected or coupled to the other element or layer or intervening elements or layers may be present. When an element or layer is referred to as being "directly on", "directly connected to" or "directly coupled to" another element or layer, no intervening elements may be present therebetween.

Like numerals refer to like elements throughout. In the drawings, the thickness, ratio, and dimension of components are exaggerated for effective description of the technical content.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections are not limited by these terms. These terms are only used to distinguish one element, component, region, layer or section from another region, layer or section. Therefore, a first element, component, region, layer or section discussed below could be termed a second element, component, region, layer or section without departing from the teachings of the present inventive concepts. As used herein, the singular forms. "a", "an" and "the" are intended to include the plural forms as well, unless the context clearly indicates otherwise.

Spatially relative terms, such as "beneath", "below", "lower", "above", "upper" and the like, may be used herein for ease of description to describe the relationship of one element or feature to another element(s) or feature(s) as illustrated in the figures. The terms are described with reference to the directions indicated in the figures.

In addition, the term "on" in the following descriptions may include the case where a component/element is disposed at a lower part as well as an upper part.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, the present invention will be explained in detail with reference to the accompanying drawings.

Figure 1B:
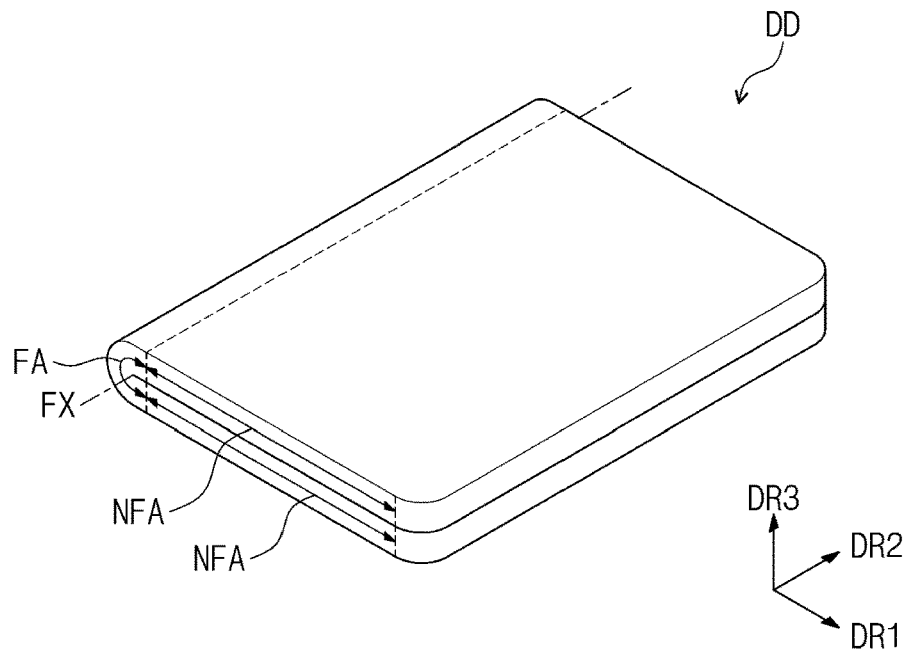
FIG. 1B is a perspective view showing a display device in a second operation according to an exemplary embodiment of the present inventive concepts.
Figure 1C:
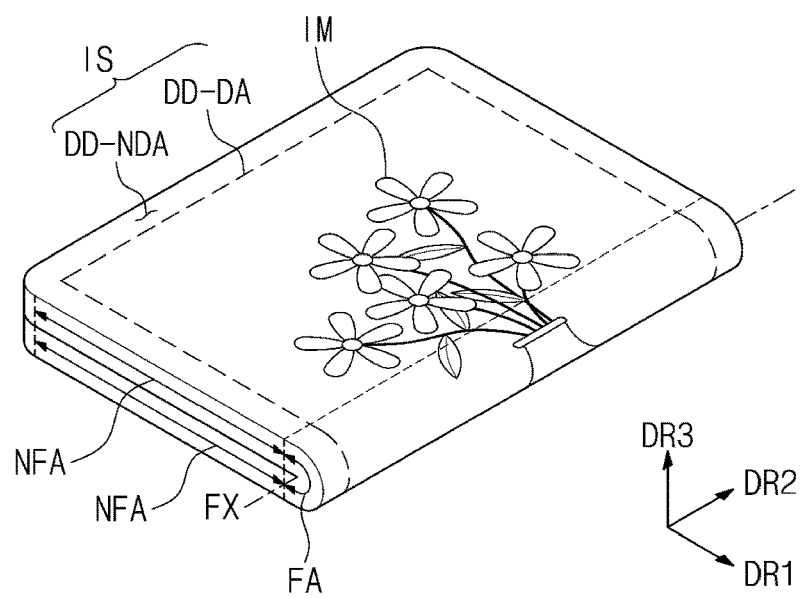
FIG. 1C is a perspective view showing a display device in a third operation according to an exemplary embodiment of the present inventive concepts.

FIG. 1A is a perspective view showing a display device DD in a first operation according to an exemplary embodiment of the present inventive concepts. FIG. 1B is a perspective view showing the display device DD in a second operation according to an exemplary embodiment of the present inventive concepts. FIG. 1C is a perspective view showing the display device DD in a third operation according to an exemplary embodiment of the present inventive concepts.

Referring to FIG. 1A, the display device DD includes a display surface IS in which an image IM is displayed in a first operation mode. As shown in the exemplary embodiment of FIG. 1A, the display surface IS may be substantially parallel to a surface defined by a first directional axis DR1 and a second directional axis DR2. A normal line direction of the display surface IS (e.g., a thickness direction of the display device DD) is indicated by a third directional axis DR3. A front surface (e.g., upper surface), a rear surface (e.g., lower surface) of the display device DD and members thereof may be distinguished from each other by the third directional axis DR3. However, directions indicated by the first, second, and third directional axes DR1, DR2, and DR3 are relative to each other and may be changed to other directions. Hereinafter, first, second, and third directions are respectively indicated by the first, second, and third directional axes DR1, DR2, and DR3 and are assigned with the same reference numerals.

In the exemplary embodiments shown in FIGS. 1A to 1C, the display device DD is a foldable display device. However, exemplary embodiments of the present inventive concepts are not limited thereto. For example, in other exemplary embodiments, the display device DD may be another flexible display device, such as a rollable display device, a bendable display device, etc. In the exemplary embodiments of FIGS. 1A to 1C, the display device DD is shown in a first operation in which the display device DD is not bent and a second and third operation in which the display device DD is in bent configurations. However, in other exemplary embodiments in which the display device DD is a different type of flexible display device (e.g., a rollable display device, a bendable display device, etc.) the operations and bent configurations of the display device DD will vary accordingly from those shown in FIGS. 1B-1C.

The display device DD may be applied to various electronic devices. For example, in an exemplary embodiment, the display device DD may be applied to a large-sized electronic item, such as a television set, a monitor, etc., or a small or a medium-sized electronic item, such as a mobile phone, a tablet computer, a car navigation unit, a game unit, a smart watch, etc. However, exemplary embodiments of the present inventive concepts are not limited thereto.

Referring to the exemplary embodiment shown in FIG. 1A, the display surface IS of the display device DD may include a display area DD-DA in which the image IM is displayed and a non-display area DD-NDA disposed adjacent to the display area DD-DA. The exemplary embodiment of FIG. 1 shows an image of a vase for the image IM. However, exemplary embodiments of the present inventive concepts are not limited thereto and the image IM may be at least one moving or still image having various different content. As shown in the exemplary embodiment of FIG. 1A, the display area DD-DA may have a substantially quadrangular shape and the non-display area DD-NDA may surround the display area DD-DA (e.g., surrounding each edge of the display area DD-DA in the first direction DR1 and the second direction DR2). However, exemplary embodiments of the present inventive concepts are not limited thereto. For example, the display area DD-DA may have a various polygonal or circular shapes and the shape of the display area DD-DA and the shape of the non-display area DD-NDA may be designed relative to each other. In other exemplary embodiments, the non-display area DD-NDA may not cover at least one side of the display area DD-DA. In another exemplary embodiment, the non-display area DD-NDA may be omitted and the display area DD-DA may extend to each of the edges of the front surface of the display device DD.

Referring to the exemplary embodiments shown in FIGS. 1A to 1C, the display device DD may include a plurality of areas defined in accordance with the operation state thereof. The display device DD may include a folding area FA folded about a folding axis FX and a non-folding area NFA that does not fold. In the exemplary embodiments shown in FIGS. 1A to 1C, the display device DD includes two non-folding areas NFA that are spaced apart in the first direction DR1 with the folding area disposed therebetween. However, exemplary embodiments of the present inventive concepts are not limited thereto. For example, in another exemplary embodiment, the display device DD may include one non-folding area NFA, three or more non-folding areas NFA, and/or two or more folding areas FA, and the non-folding area(s) NFA and folding area(s) FA may be variously arranged.

As shown in the exemplary embodiment of FIG. 1B, the display device DD may be inwardly folded in a second operation such that display surfaces IS of the two non-folding areas NFA face each other. As shown in the exemplary embodiment of FIG. 1C, the display device DD may be outwardly folded in a third operation such that the display surface IS is exposed to the outside and forms front and back surfaces of the display device DD (e.g., in the third direction DR3) in the third operation.

In an exemplary embodiment, the display device DD may be configured to repeatedly perform the first and second operation modes shown in FIGS. 1A and 1B, the first and third operation modes shown in FIGS. 1A and 1C or the first, second and third operation modes shown in FIGS. 1A to 1C. However, exemplary embodiments of the present inventive concepts are not limited thereto and the folding area FA may be defined to correspond to the user's operation performed on the display device DD. For instance, different from FIGS. 1B and 1C, the folding area FA may be defined to be substantially parallel to the first directional axis DR1, may be defined in a diagonal direction (e.g., between the first direction DR1 and the second direction DR2), etc.

As shown in FIGS. 1A-1C, in exemplary embodiments in which the display device DD includes two non-folding areas NFA, the non-folding areas NFA may have substantially the same size (e.g., area in the first direction DR1 and second direction DR2). However, exemplary embodiments of the present inventive concepts are not limited thereto and the size of one or more of the non-folding areas NFA may differ from each other. In an exemplary embodiment, the size of the folding area FA may be the same as or may differ from the size of one or more non-folding areas NFA. According to an exemplary embodiment, the size of the folding area FA may be determined depending on a radius of curvature without being fixed.

Figure 2:
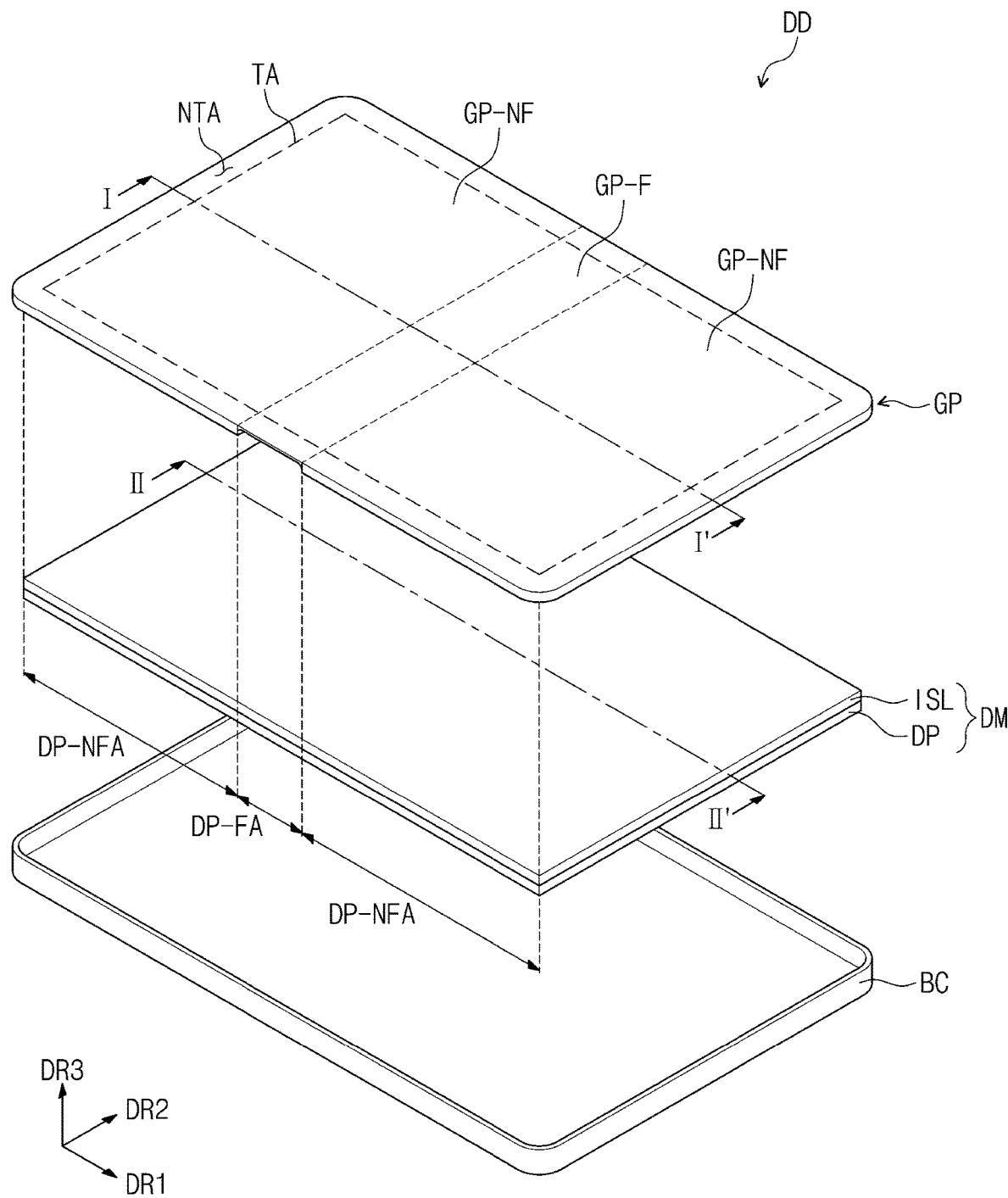
FIG. 2 is an exploded perspective view showing a display device according to an exemplary embodiment of the present inventive concepts.

FIG. 2 is an exploded perspective view showing the display device DD according to an exemplary embodiment of the present inventive concepts.

Referring to the exemplary embodiment of FIG. 2, the display device DD may include a glass substrate GP, a display module DM, and an accommodating member BC. For example, as shown in the exemplary embodiment of FIG. 2, a bottom surface of the glass substrate GP may be disposed on a top surface of the display module DM. The accommodating member BC may accommodate the display module DM. In an exemplary embodiment, the accommodating member BC may include a hinge. The hinge may be disposed at a portion of the accommodating member BC, which overlaps the folding area FA (e.g., in the third direction DR3). However, exemplary embodiments of the present inventive concepts are not limited thereto. For example, in another exemplary embodiment, the display device DD may not include the accommodating member BC.

The glass substrate GP may be disposed on the display module DM (e.g., in the third direction DR3) and may transmit an image IM provided from the display module DM to the outside. The glass substrate GP may include a transmission area TA for transmitting the image IM and a non-transmission area NTA which does not transmit the image IM. In an exemplary embodiment, the transmission area TA may correspond to the display area DD-DA of the display surface IS and may have a shape corresponding to the display area DD-DA. The image IM displayed through the display area DD-DA of the display device DD may be viewed from the outside through the transmission area TA of the glass substrate GP.

In an exemplary embodiment, the non-transmission area NTA may correspond to the non-display area DD-NDA of the display surface IS and may have a shape corresponding to the non-display area DD-NDA. The non-transmission area NTA may have a relatively low light transmittance when compared with the transmission area TA. However, exemplary embodiments of the present inventive concepts are not limited thereto and the non-transmission area NTA may be omitted.

The glass substrate GP may include a folding portion GP-F and a non-folding portion GP-NF. The folding portion GP-F of the glass substrate GP may correspond to (e.g., be disposed in) the folding area FA of the display device DD. The non-folding portion GP-NF of the glass substrate GP may correspond to the non-folding area NFA of the display device DD. The folding portion GP-F may be folded when the above-described operation modes are carried out. Accordingly, the folding portion GP-F may have a more flexible property than the non-folding portion GP-NF, which is not folded, when the operation modes are carried out. Detailed descriptions will be described later.

As shown in the exemplary embodiment of FIG. 2, the display module DM may be disposed between the glass substrate GP and the accommodating member BC (e.g., in the third direction DR3). The display module DM may include a display panel DP and an input sensing layer ISL disposed on the display panel DP. For example, as shown in the exemplary embodiment of FIG. 2, a bottom surface of the input sensing layer ISL may be disposed on a top surface of the display panel DP. The display panel DP may generate the image IM and may transmit the generated image to the glass substrate. In an exemplary embodiment of the present inventive concepts, the display panel DP may be a self light emitting type display panel. However, exemplary embodiments of the present inventive concepts are not limited thereto. In an exemplary embodiment, the display panel DP may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, for convenience of description, the display panel DP will be described as an organic light emitting display panel herein.

The display panel DP may include a folding area DP-FA and a non-folding area DP-NFA. The folding area DP-FA of the display panel DP may correspond to (e.g., be disposed in) the folding area FA shown in FIGS. 1A to 1C, and the non-folding area DP-NFA of the display panel DP may correspond to (e.g., be disposed in) the non-display area DD-NDA shown in FIGS. 1A to 4C.

The input sensing layer ISL may be disposed between the glass substrate GP and the display panel DP. As shown in the exemplary embodiment of FIG. 2, the input sensing layer ISL may entirely overlap the transmission area TA of the glass substrate GP (e.g., in the third direction DR3). However, exemplary embodiments of the present inventive concepts are not limited thereto. For example, in another exemplary embodiment, the input sensing layer ISL may overlap only a portion of the transmission area TA or only the non-transmission area NTA. The input sensing layer ISL may sense an input applied thereto from the outside. The input provided from the outside may be provided in a variety of types. For example, the input may be provided in a variety of ways. For example, the input may include various external inputs, such as a part of a user's body, a stylus pen, a light, a heat, or a pressure. In addition, the external inputs may include a proximity input (e.g., hovering) applied when approaching close to or adjacent to the display device DD at a predetermined distance as well as a touch input by a user's body (e.g., user's hand or finger).

The input sensing layer ISL may sense the input and may obtain coordinate information about the input. In an exemplary embodiment of the present inventive concepts, the input sensing layer ISL may sense a variation in capacitance, which is caused by external objects, and may sense the external input. For example, the input sensing layer ISL may be a capacitive input sensor.

Figure 3A:
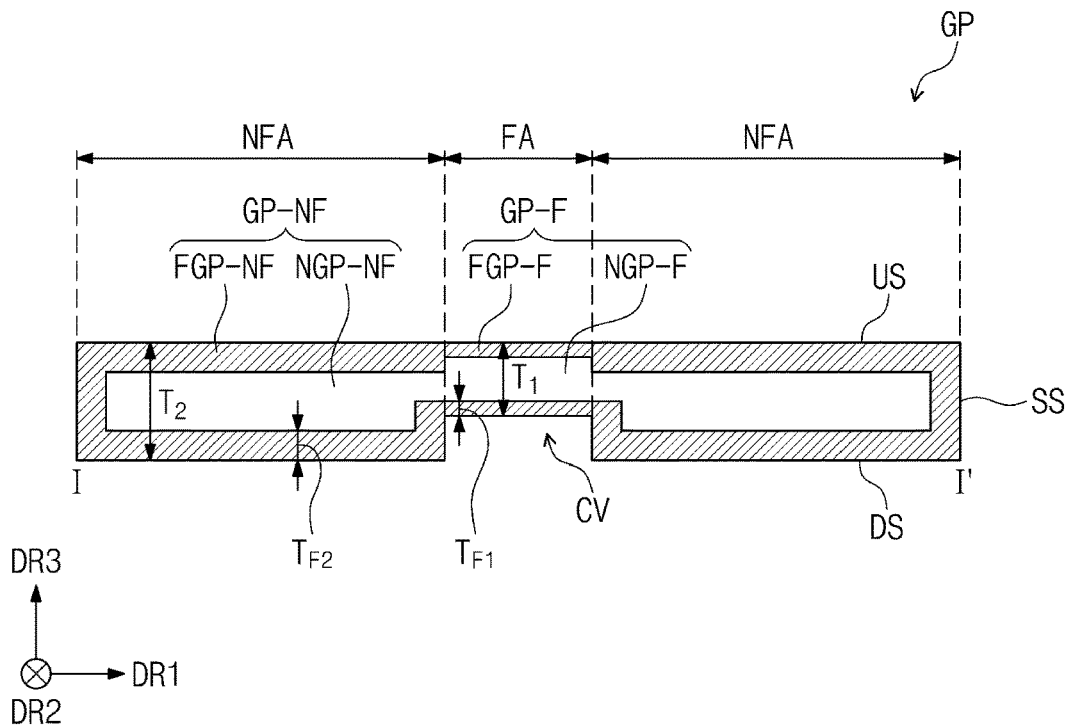
FIG. 3A is a cross-sectional view of a glass substrate of a display device taken along line I-I' of FIG. 2 according to an exemplary embodiment of the present inventive concepts.
Figure 3B:
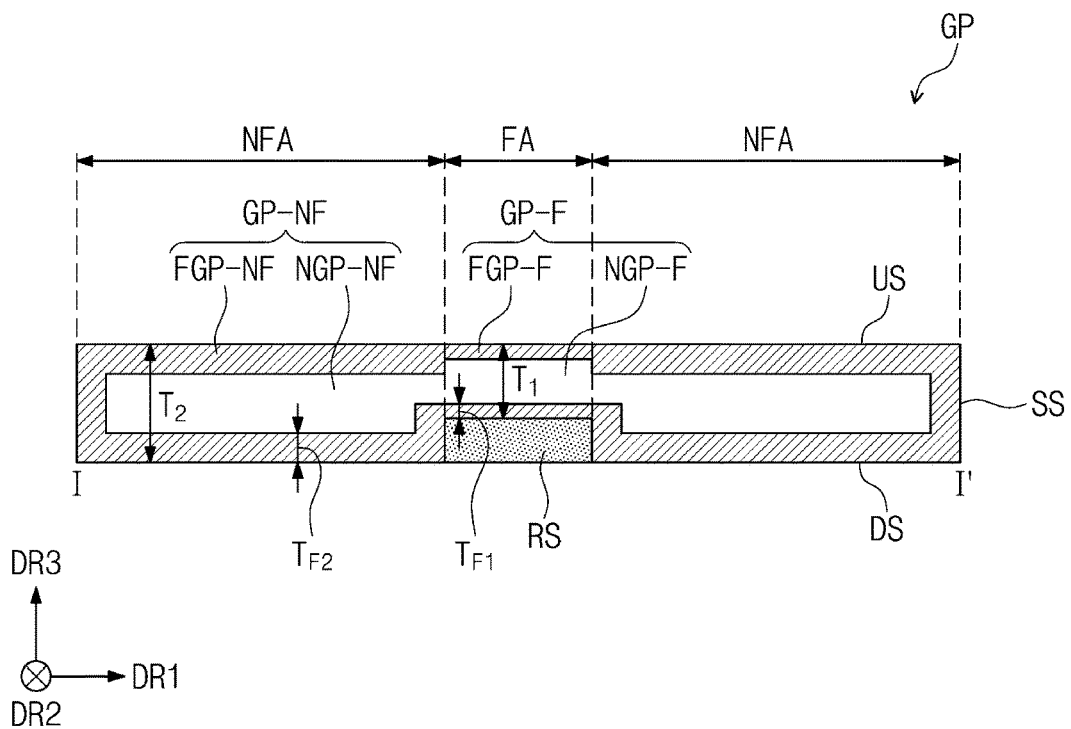
FIG. 3B is a cross-sectional view showing a glass substrate taken along line I-I' of FIG. 2 according to an exemplary embodiment of the present inventive concepts.

Hereinafter, the glass substrate GP according to exemplary embodiments of the present inventive concepts will be described in detail with reference to FIGS. 3A and 3B. FIG. 3A is a cross-sectional view showing the glass substrate GP of the display device DD taken along line I-I' of FIG. 2 according to an exemplary embodiment of the present inventive concepts. FIG. 3B is a cross-sectional view showing the glass substrate GP according to an exemplary embodiment of the present inventive concepts. FIG. 3B shows the cross-section corresponding to the glass substrate GP shown in FIG. 3A.

The glass substrate GP may include a first portion comprising a folding portion GP-F in the folding area FA of the display device DD and a second portion comprising a non-folding portion GP-NF in the non-folding area NFA of the display device DD. The folding portion GP-F of the glass substrate GP may overlap the folding area DP-FA of the display panel DP (e.g., in the third direction DR3) and the non-folding portion GP-NF of the glass substrate GP may overlap the non-folding area DP-NFA of the display panel DI (e.g., in the third direction DR3). The folding portion GP-F of the glass substrate GP may be folded or unfolded when the display device DD is operated in the operation modes described with reference to FIGS. 1A to 1C. In the present inventive concepts, the folding portion GP-F may also be referred to as the first portion. The non-folding portion GP-NF may not be folded when the display device is operated in each of the operation modes described with reference to FIGS. 1A to 1C. In the present inventive concepts, the non-folding portion GP-NF may also be referred to as the second portion. As shown in the exemplary embodiments of FIGS. 3A and 3B, an area of the non-folding portion GP-NF may be greater than an area of the folding portion GP-F. However, exemplary embodiments of the present inventive concepts are not limited thereto.

The folding portion GP-F may have a first thickness $T_1$ (e.g., length in the third direction DR3), and the non-folding portion GP-NF may have a second thickness $T_2$. In an exemplary embodiment, the second thickness $T_2$ of the non-folding portion GP-NF may be greater than the first thickness $T_1$ of the folding portion GP-F. Since the non-folding portion GP-NF has the second thickness $T_2$ that is greater than the first thickness $T_1$ of the folding portion GP-F, the glass substrate GP may have an increased durability (e.g., a strong durability) against an external impact. Since the folding portion GP-F has the first thickness $T_1$ that is smaller than the second thickness $T_2$, the folding portion GP-F may be easily folded or unfolded and may not be damaged during the folding and unfolding operations. For example, in an exemplary embodiment, the first thickness $T_1$ may be in a range of about 10 micrometers to about 50 micrometers. For example, the first thickness $T_1$ may be in a range of about 30 micrometers to about 50 micrometers. In another exemplary embodiment, the first thickness $T_1$ may be in a range of about 35 micrometers to about 45 micrometers. When the first thickness $T_1$ is in the above-described ranges, the folding portion GP-F may be easily folded or unfolded and may have sufficient flexibility. Therefore, the folding portion GP-F may not be damaged during the folding operation. For example, when the first thickness $T_1$ is smaller than about 10 micrometers, the folding portion GP-F may be easily damaged by an external impact. When the first thickness $T_1$ exceeds about 50 micrometers, the flexibility of the glass substrate GP is lowered, and as a result, the glass substrate GP may be easily damaged during the folding and unfolding operation. In an exemplary embodiment, the second thickness $T_2$ may be in a range of about 40 micrometers to about 100 micrometers. For example, the second thickness $T_2$ may be in a range of about 60 micrometers to about 80 micrometers. When the second thickness $T_2$ is in the above-described ranges, the non-folding portion GP-NF may have an increased durability (e.g., a strong durability) against an external impact.

The glass substrate GP may include a lower surface DS (e.g., extending substantially in the first direction DR1) adjacent to the display panel DP, an upper surface US (e.g., extending substantially in the first direction DR1) exposed to the outside, and a side surface SS (e.g., extending substantially in the third direction DR3) connecting the lower surface DS and the upper surface US. In exemplary embodiments of the present inventive concepts, the lower surface DS may be referred to as a "first surface", the upper surface US may be referred to as a "second surface", and the side surface SS may be referred to as a "third surface". Since the second thickness $T_2$ is greater than the first thickness $T_1$, a concave portion CV may be defined in the glass substrate GP in the folding area FA. For example, as shown in the exemplary embodiment of FIG. 3A, the concave portion CV may be defined in the lower surface DS of the glass substrate GP. In the exemplary embodiment in which the concave portion CV is defined in the lower surface DS, the glass substrate GP may be easily folded inwardly, such as in the second operation shown in FIG. 1B. However, in another exemplary embodiment the concave portion CV may be defined in the upper surface US of the glass substrate GP In this exemplary embodiment, the glass substrate GP may be easily folded outwardly, such as in the third operation shown in FIG. 1C. However, exemplary embodiments of the present inventive concepts are not limited thereto. For example, in another exemplary embodiment, the concave portion CV may be defined in both the upper surface US and the lower surface DS of the glass substrate GP and the display device DD may perform both the second operation and the third operation shown in FIGS. 1-1C. In the exemplary embodiments of FIGS. 3A and 3B, the side surface SS is illustrated as a flat surface. However, exemplary embodiments of the present inventive concepts are not limited thereto. For example, the side surface SS may be a curved surface.

The glass substrate GP may include a non-reinforced folding layer NGP-F and a reinforced folding layer FGP-F in the folding portion GP-F and a non-reinforced non-folding layer NGP-NF and a reinforced non-folding layer FGP-NF in the non-folding portion GP-NF. In the present inventive concepts, the non-reinforced folding layer NGP-F and the non-reinforced non-folding layer NGP-NF may be referred to as "first layers", and the reinforced folding layer FGP-F and reinforced non-folding layer FGP-NF may be referred to as "second layers". As shown in the exemplary embodiment of FIG. 3A, the reinforced non-folding layer FGP-NF may be disposed on top, bottom and a lateral side surface of the non-reinforced non-folding layer NGP-NF. The reinforced folding layer FGP-F may be disposed on top and bottom surfaces of the non-reinforced folding layer NGP-F. The lateral ends (e.g., in the first direction DR1) of the reinforced folding layer FGP-F and the non-reinforced folding layer NGP-F may contact the lateral ends of the reinforced non-folding layer FGP-NF and/or the non-reinforced non-folding layer NGP-NF.

In an exemplary embodiment, the reinforced folding layer FGP-F and the reinforced non-folding layer FGP-NF may have a compressive strength (e.g., resistance to compressive stress) that is greater than the compressive strength of the non-reinforced folding layer NGP-F and the non-reinforced non-folding layer NGP-NE. In an exemplary embodiment, the non-reinforced folding layer NGP-F and non-reinforced non-folding layer NGP-NF may include a first alkali metal cation, and the reinforced folding layer FGP-F and reinforced non-folding layer FGP-NF may include a second alkali metal cation having an ionic radius greater than an ionic radius of the first alkali metal cation. For example, in an exemplary embodiment, the first alkali metal cation may be at least one cation selected from $Li^+$, $Na^+$, $K^+$, and $Rb^+$. In an exemplary embodiment, the second alkali metal cation may be at least one cation selected from $Na^+$, $K^+$, $Rh^+$ and $Cs^+$. For example, the first alkali metal cation may be $Na^+$, and the second alkali metal cation may be $K^+$. Since the reinforced folding layer FGP-F and the reinforced non-folding layer FGP-NF include the alkali metal cation having the ionic radius that is greater than the ionic radius of the alkali metal cation included in the non-reinforced folding layer NGP-F and the non-reinforced non-folding layer NGP-NF, the reinforced layers may have a compressive strength that is greater than the compressive strength of the non-reinforced layers.

In an exemplary embodiment, a concentration of the second alkali metal cation in the reinforced folding layer FGP-F and the reinforced non-folding layer FGP-NF may decrease as they get closer to the non-reinforced folding layer NGP-F and non-reinforced non-folding layer NGP-NF, respectively. Accordingly, the compressive strength of the reinforced folding layer FGP-F and the reinforced non-folding layer FGP-NF may decrease as the distance from the non-reinforced folding layer NGP-F and the non-reinforced non-folding layer NGP-NF decreases.

The reinforced folding layer FGP-F and the reinforced non-folding layer FGP-NF may be formed to cover the non-reinforced folding layer NGP-F and the non-reinforced non-folding layer NGP-NF. For example, the reinforced folding layer FGP-F and the reinforced non-folding layer FGP-NF may be formed to cover an entire surface of the glass substrate GP. In an exemplary embodiment, the reinforced folding layer FGP-F and the reinforced non-folding layer FGP-NF may cover the entire portions of the upper surface US, lower surface DS and side surfaces of the glass substrate GP. Since the glass substrate GP includes the reinforced layers FGP-F and FGP-NF that cover the glass substrate GP, the glass substrate GP may have a high surface strength. Therefore, the glass substrate GP according to the exemplary embodiment may have an increased durability (e.g., a strong durability) against external impacts. As shown in the exemplary embodiments of FIGS. 3A and 38, the reinforced layers FGP-F and FGP-NF and the non-reinforced layers NGP-F and NGP-NF may be integrally connected to each other.

Since the folding portion GP-F is folded or unfolded, the folding portion GP-F may be damaged during the folding operation when a thickness (e.g., length in the third direction DR3) of the reinforced folding layer FGP-F is too large. For example, as the folding portion GP-F experiences high compressive stress, a deformation or crack may occur during the folding and unfolding operations. When the thickness of the reinforced non-folding layer FGP-NF is too small in the non-folding portion GP-NF, the glass substrate GP may be easily damaged due to the external impact.

According to an exemplary embodiment, a thickness $T_{F2}$ of the reinforced non-folding layer FGP-NF may be greater than a thickness $T_{F1}$ of the reinforced folding layer FGP-F. As shown in the exemplary embodiment of FIGS. 3A-3B, the thickness $T_{F1}$ of the reinforced folding layer FGP-F may refer to the thicknesses of each layer on a top surface and bottom surface of the non-reinforced folding layer NGP-F. For example, the thickness $T_{F1}$ of the reinforced folding layer FGP-F in the exemplary embodiments of FIGS. 3A-3B is shown as the thickness of the reinforced folding layer FGP-F on the bottom surface of the non-reinforced folding layer NGP-F. However, in an exemplary embodiment, the thickness $T_{F1}$ of the reinforced folding layer FGP-F on the top surface of the non-reinforced folding layer NGP-F may have a same thickness as the reinforced folding layer FGP-F on the bottom surface of the non-reinforced folding layer NGP-F. Likewise, the thickness $T_{F2}$ of the reinforced non-folding layer FGP-NF in the exemplary embodiments of FIGS. 3A-3B is shown as the thickness of the reinforced non-folding layer FGP-NF on the bottom surface of the non-reinforced non-folding layer NGP-NF. However, in an exemplary embodiment, the thickness $T_{F2}$ of the reinforced non-folding layer FGP-NF on the top surface and side surface of the non-reinforced non-folding layer NGP-NF may have a same thickness as the reinforced non-folding layer FGP-NF on the bottom surface of the non-reinforced non-folding layer NGP-NF.

For example, in an exemplary embodiment, the reinforced non-folding layer FGP-NF may have a thickness $T_{F2}$ in a range of about 6 micrometers to about 30 micrometers. In an exemplary embodiment, the reinforced folding layer FGP-F may have a thickness $T_{F1}$ in a range of about 3 micrometers to about 15 micrometers. For example, in an exemplary embodiment, the thickness $T_{F1}$ of the reinforced folding layer FGP-F may be 50% or less than the thickness $T_{F1}$ of the reinforced non-folding layer FGP-NF. For example, the thickness $T_{F1}$ of the reinforced folding layer FGP-F may be in a range of about 20% to about 50% of the thickness $T_{F2}$ of the reinforced non-folding layer FGP-NF. Since the reinforced folding layer FGP-F may have a thickness $T_{F1}$ in the above-mentioned range, the compressive strength per unit area in the folding portion GP-F may be smaller than the compressive strength per unit area in the non-folding portion GP-NF. Accordingly, the folding portion GP-F may have more flexibility than the non-folding portion GP-NF and may not be damaged even though the folding and unfolding operations are repeatedly performed.

However, the thickness $T_{F1}$ of the reinforced folding layer FGP-F and the thickness $T_{F2}$ of the reinforced non-folding layer FGP-NF may be uniform throughout the respective layer. For example, the reinforced folding layer FGP-F and the reinforced non-folding layer FGP-NF may each have a uniform depth from the surface of the glass substrate GP. As shown in the exemplary embodiments of FIGS. 3A and 3B, the reinforced folding layer FGP-F and the reinforced non-folding layer FGP-NF may not be separate configurations and may have an integral shape.

According to an exemplary embodiment, the glass substrate GP may include $SiO_2$. The glass substrate GP may further include at least one compound selected from $Al_2O_3$, $Li_2O$, $Na_2O$, $K_2O$, MgO, and CaO in addition to $SiO_2$. In addition, the glass substrate GP may further include $Fe_2O_3$, ZnO, $TiO_2$, or $P_2O_5$. However, exemplary embodiments of the present inventive concepts are not limited thereto.

Referring to the exemplary embodiment of FIG. 3B, the concave portion CV may be filled with a resin RS. The resin RS may be an optically clear resin having a visible light transmittance of about 90% or more. The resin RS in the concave portion CV may prevent a foreign substance from entering the concave portion CV.

In an exemplary embodiment, the resin RS may include one or more base polymers selected from the group consisting of an acrylic-based polymer, a silicone-based polymer, a polyester, a polyurethane, a polyamide, a polyvinyl ether, a vinyl acetate-vinyl chloride copolymer, an epoxy-based resin, and a modified polyolefin. The resin RS may further include additives such as a crosslinking agent and a tackifier other than the base polymer. The additives may be used alone or in combination of two or more thereof.

In an exemplary embodiment, the resin RS may have a refractive index that is similar to or the same as the refractive index of the glass substrate GP. For example, in an exemplary embodiment, a difference in refractive index between the resin RS and the glass substrate GP may be equal to or smaller than about 0.1. When the difference in refractive index between the resin RS and the glass substrate GP is large, a difference in visibility may occur between the folding portion GP-F and the non-folding portion GP-NF with respect to a light emitted from the display module DM (refer to FIG. 2). Since the glass substrate GP according to the exemplary embodiment is filled with the resin RS, the display module DM may provide superior visibility for the image IM generated by the display module DM. Hereinafter, a display module according to the exemplary embodiments shown in FIGS. 4-5 will be described in detail.

Figure 4:
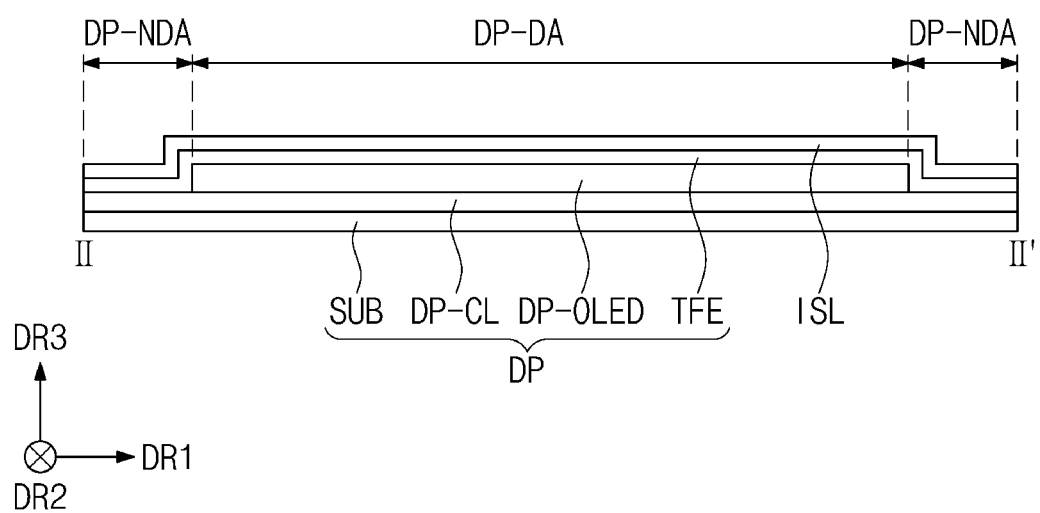
FIG. 4 is a cross-sectional view showing a display module of a display device taken along line II-II' of FIG. 2 according to an exemplary embodiment of the present inventive concepts.
Figure 5:
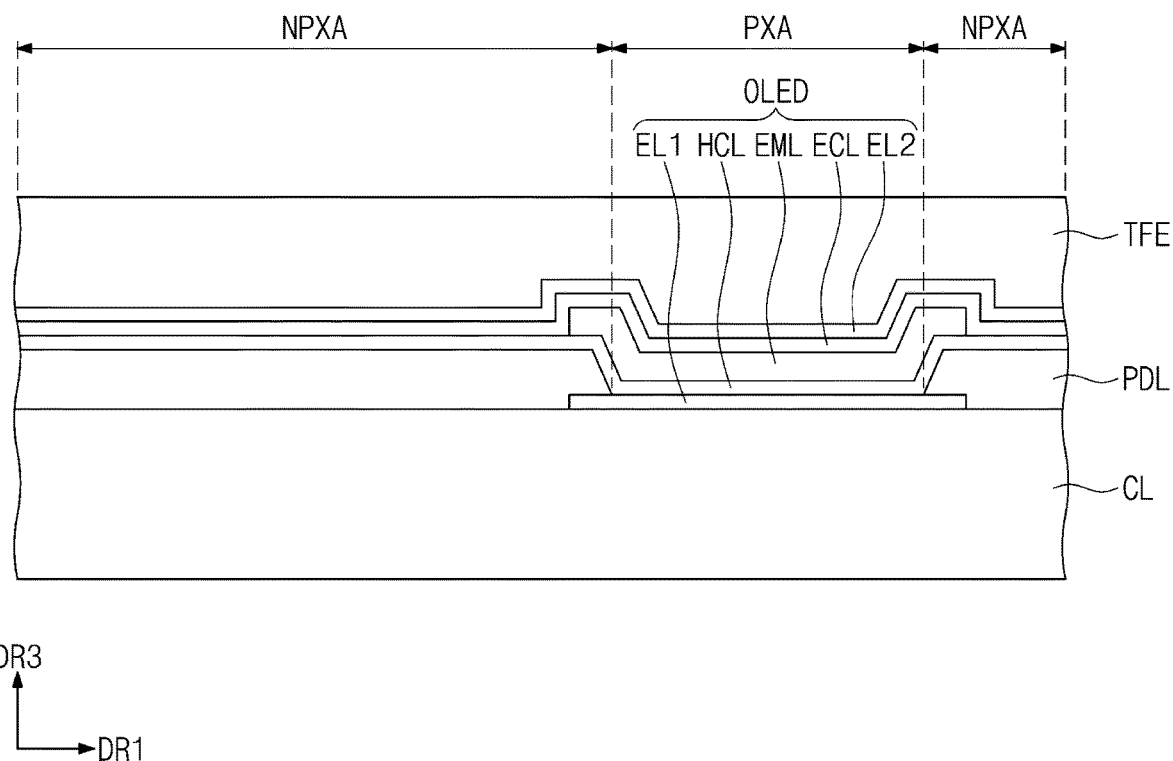
FIG. 5 is a cross-sectional view showing a display panel according to an exemplary embodiment of the present inventive concepts.

FIG. 4 is a cross-sectional view showing the display module of a display device taken along a line II-II' of FIG. 2 according to an exemplary embodiment of the present inventive concepts. FIG. 5 is a cross-sectional view showing the display panel according to an exemplary embodiment of the present inventive concepts.

Referring to the exemplary embodiments shown in FIGS. 4 and 5, the display panel DP may include a base substrate SUB, a circuit element layer DP-CL, a display element layer DP-OLED, and a thin film encapsulation layer TFE. The circuit element layer DP-CL may be disposed on the base substrate SUB (e.g., in the third direction DR3). The display element layer DP-OLED may be disposed on the circuit element layer DP-CL (e.g., in the third direction DR3). The thin film encapsulation layer TFE may be disposed on the display element layer DP-OLED (e.g., in the third direction DR3).

The display panel DP may include a display area DP-DA and a non-display area DP-NDA. The display area DP-DA of the display panel DP may correspond to the display area DD-DA shown in the exemplary embodiments of FIGS. 1A to 1C and/or the transmission area TA shown in the exemplary embodiment of FIG. 2. The non-display area DP-NDA may correspond to the non-display area DD-NDA shown in the exemplary embodiment of FIGS. 1A to 1C and/or the non-transmission area NTA shown in the exemplary embodiment of FIG. 2.

In an exemplary embodiment, the base substrate SUB may include at least one plastic film. For example, the base substrate SUB may include a plastic substrate, a glass substrate, a metal substrate, or an organic/inorganic composite substrate. The base substrate SUB may include a synthetic resin film. A synthetic resin film may include a heat-curable resin. The base substrate SUB may have a multi-layer structure. For example, in an exemplary embodiment, the base substrate SUB may have a three-layer structure of a synthetic resin layer, an adhesive layer, and a synthetic resin layer. In an exemplary embodiment, the synthetic resin layer may be a polyimide-based resin layer. However, exemplary embodiments of the present inventive concepts are not limited thereto. The synthetic resin layer may include at least one compound selected from an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin. Further, the base substrate SUB may include a glass substrate, a metal substrate, or an organic/inorganic composite substrate.

The circuit element layer DP-CL may include at least one intermediate insulating layer and a circuit element. The intermediate insulating layer may include at least one intermediate inorganic layer and at least one intermediate organic layer. The circuit element may include signal lines and a pixel driving circuit.

The display element layer DP-OLED may include an organic light emitting diode OLED. The organic light emitting diode OLED may include a first electrode EL1, a hole transport layer HCL, a light emitting layer EML, an electron transport layer ECL, and a second electrode EL2 (e.g., sequentially disposed thereon in the third direction DR3). In an exemplary embodiment, the light emitting layer EML may include an organic light emitting material. However, exemplary embodiments of the present inventive concepts are not limited thereto. For example, in another exemplary embodiment, the light emitting layer EML may include an inorganic light emitting material, such as a quantum dot or a quantum bar.

The organic light emitting diode OLED may further include a capping layer disposed on the second electrode EL2. The capping layer may protect the organic light emitting diode OLED or may control optical characteristics of the organic light emitting diode OLED.

The display element layer DP-OLED may further include an organic layer such as a pixel definition layer PDL. The pixel definition layer PDL may be disposed on the circuit element layer DP-CL, and at least a portion (e.g., a central portion) of the first electrode EL1 may be exposed through the circuit element layer DP-CL. The pixel definition layer PDL may define a light emitting area PXA and a non-light emitting area NPXA adjacent to the light emitting area PXA.

The thin film encapsulation layer TFE may be disposed on the display element layer DP-OLED (e.g., in the third direction DR3) and may encapsulate the display element layer DP-OLED. In an exemplary embodiment, a lower surface of the thin film encapsulation layer TFE may be disposed directly on an upper surface of the organic light emitting diode OLED. However, exemplary embodiments of the present inventive concepts are not limited thereto. For example, in exemplary embodiment in which the organic light emitting diode OLED further includes a capping layer, the thin film encapsulation layer TFE may be disposed directly on the capping layer. In an exemplary embodiment, the thin film encapsulation layer TFE may include at least one organic layer and at least one inorganic layer. The thin film encapsulation layer TFE may have a stack structure of inorganic layer/organic layer/inorganic layer. The thin film encapsulation layer TFE may protect the display element layer DP-OLED from moisture, oxygen, and foreign substance such as dust particles.

The input sensing layer ISL may be disposed on the display panel DP. For example, the input sensing layer ISL may be disposed directly on the display panel DP. In an exemplary embodiment, the input sensing layer ISL may include an insulating layer and a conductive layer. A base insulating layer may be disposed under the input sensing layer ISL. In an exemplary embodiment, the input sensing layer ISL may be provided separately and may be attached to the display panel DP by an adhesive layer. However, exemplary embodiments of the present inventive concepts are not limited thereto. For example, the input sensing layer ISL may be formed directly on the display panel DP through successive processes.

FIGS. 6A to 6F are cross-sectional views and perspective views showing a manufacturing method of the glass substrate GP according to exemplary embodiments of the present inventive concepts.

Referring to FIGS. 6A to 6F, the manufacturing method of the glass substrate GP may include providing a base glass substrate GP-P, performing a first chemical reinforcement process of the base glass substrate GP-P, and a second chemical reinforcement process of the base glass substrate GP-P. The first chemical reinforcement process and the second chemical reinforcement process includes one process to chemically reinforce a non-folding portion of the base glass substrate GP-P, and the other operation is to chemically reinforce a folding portion and a non-folding portion of the base glass substrate GP-P. Hereinafter, the manufacturing method of the glass substrate GP according to exemplary embodiments of the present inventive concepts will be described with reference to FIGS. 6A to 6F.

Figure 6A:
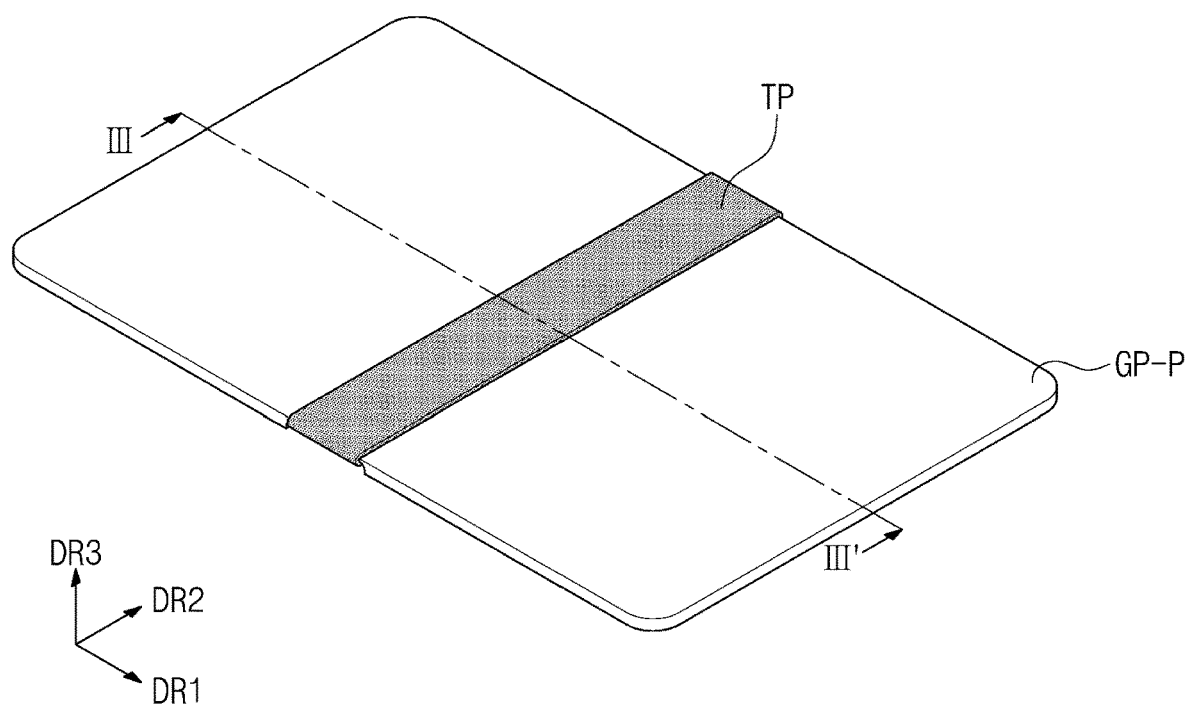
FIG. 6A is a perspective view showing a method of manufacturing a glass substrate according to an exemplary embodiment of the present inventive concepts.
Figure 6B:
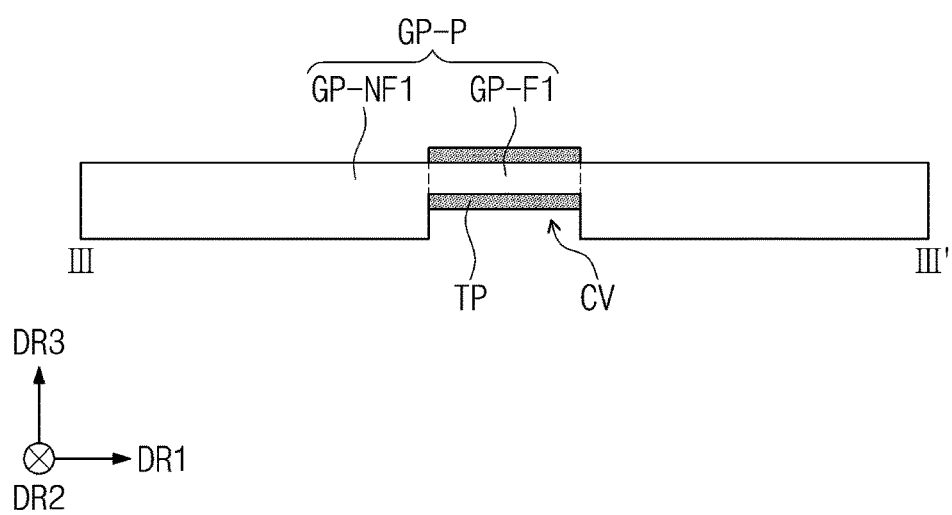
FIG. 6B is a cross-sectional view showing a method of manufacturing a glass substrate taken along line III-III' of FIG. 6A according to an exemplary embodiment of the present inventive concepts.

FIG. 6A is a perspective view showing the glass substrate GP-P according to an exemplary embodiment of the present inventive concepts. FIG. 6B is a cross-sectional view taken along the line III-III' of FIG. 6A according to an exemplary embodiment of the present inventive concepts.

FIGS. 6A and 6B schematically show the providing of the base glass substrate GP-P and the chemical reinforcing of a second portion GP-NF1 of the base glass substrate GP-P.

The base glass substrate GP-P may include the first portion GP-F1 and the second portion GP-NF1 adjacent to the first portion GP-F1. The first portion GP-F1 of the base glass substrate GP-P may be a non-reinforced folding layer that is folded or unfolded depending on an operation mode of the display device DD when the glass substrate GP is provided on the display device DD. The second portion GP-NF1 may be a non-reinforced non-folding layer of the base glass substrate GP-P that may not be folded when the glass substrate GP is provided on the display device DD. The first portion GP-F1 of the base glass substrate GP-P may correspond to the folding portion GP-F of the glass substrate GP, and the second portion GP-NF1 of the base glass substrate GP-P may correspond to the non-folding portion GP-NF of the glass substrate GP. Accordingly, the second portion GP-NF1 may have a thickness that is larger than the thickness of the first portion GP-F1, and the concave portion CV may be defined in at least one surface of the first portion GP-F1. In an exemplary embodiment, the concave portion CV may be formed through a polishing or etching process.

The reinforcing of the second portion GP-NF1 may include covering the first portion GP-F1 using a heat resistant member. FIGS. 6A and 6B show a heat resistant tape TP as an example of the heat resistant member.

In the covering of the first portion GP-F1 using the heat resistant member TP, the heat resistant member TP may entirely cover the first portion GP-F1. For example, as shown in the exemplary embodiment of FIG. 6B, the heat resistant member TP may cover an entire top surface and bottom surface of the first portion GP-F1. In an exemplary embodiment, the heat resistant member TP may include a material that is not deformed or damaged in a temperature that is less than or equal to 500° C. In another exemplary embodiment, the heat resistant member TP may include a material that is not deformed or damaged in a temperature that is less than or equal to about 400° C. For example, the first portion GP-F1 may be coated with the heat resistant material or may be covered by the heat resistant tape TP attached thereto. When the heat resistant tape TP is attached to the first portion GP-F1, the process may be simplified as compared to exemplary embodiments in which the first portion GP-F1 is coated with the heat resistant material. Accordingly, a process time and a manufacturing cost may be reduced.

In an exemplary embodiment, the heat resistant tape TP may include an organic polymer resin. For example, the organic polymer resin may include an aromatic group or may include a crosslink to increase heat resistance. However, exemplary embodiments of the present inventive concepts are not limited thereto. In an exemplary embodiment, the heat resistant tape TP may include at least one of polyphenylenesulfide (PPS), polyphthalamide (PPA), polysulfone (PSU), polyethersulfone (PES), polyetherimide (PEI), polyether ether ketone (PEEK), poly ketone sulfide (PKS), polyethylene naphthalate (PEN), and polyimide (PI). In another exemplary embodiment, the heat resistant tape TP may include a glass fiber, a cellulose fiber, or the like.

Figure 6C:
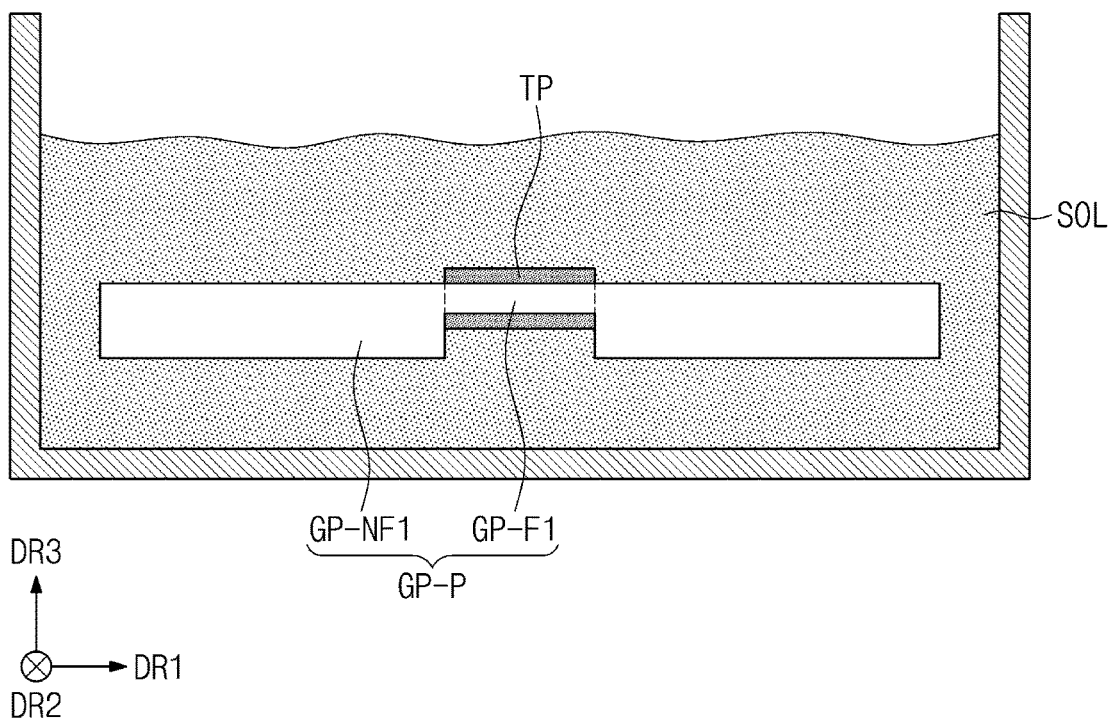
FIGS. 6C to 6F are cross-sectional views showing a method of manufacturing a glass substrate according to exemplary embodiments of the present inventive concepts.
Figure 6D:
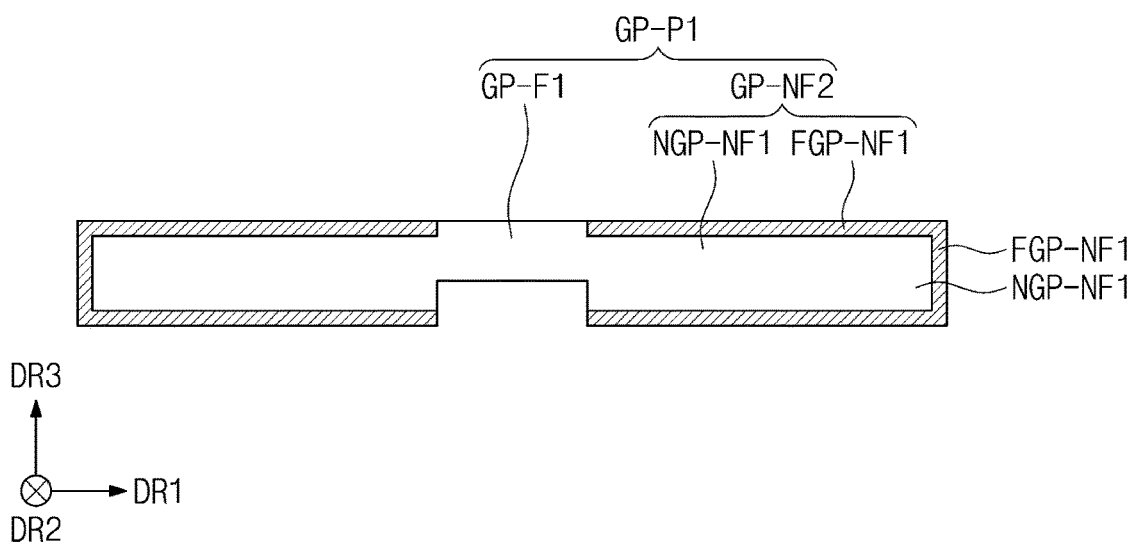

FIGS. 6C and 6D show the chemical reinforcing of the second portion GP-NF1 of the base glass substrate GP-P as an example.

Referring to the exemplary embodiments shown in FIGS. 6C and 6D, the manufacturing method of the glass substrate GP may include chemical reinforcing the second portion GP-NF1 of the base glass substrate GP-P and removing the heat resistant member TP.

In an exemplary embodiment, the base glass substrate GP-P may include the first alkali metal cation. The chemical reinforcing of the second portion GP-NF1 of the base glass substrate GP-P may include an ion-replacing operation in which the first alkali metal cation of the second portion GP-NF1 is replaced with the second alkali metal cation having the ionic radius greater than the first alkali metal cation.

As the first alkali metal cation included in the base glass substrate GP-P is replaced with the second alkali metal cation having the ionic radius greater than the first alkali metal cation, a surface reinforcing of the base glass substrate GP-P may be performed. For example, the surface reinforcing may be achieved by replacing $Na^+$ ions on the surface of the base glass substrate GP-P with $K^+$ ions.

Referring to FIG. 6C, the ion-replacing operation may include providing a solution SOL in which the second alkali metal cation is dissolved to the surface of the base glass substrate GP-P and heating the solution SOL in which the second alkali metal cation is dissolved at a temperature between about 350° C. to about 500° C. The order of providing the solution SOL in which the second alkali metal cation is dissolved to the surface of the base glass substrate GP-P and heating the solution SOL in which the second alkali metal cation is dissolved to a temperature in a range of about 350° C. to about 500° C. is not particularly limited.

When the solution SOL in which the second alkali metal cation is dissolved is heated at the temperature smaller than about 350° C., the ion replacement may not occur sufficiently or the process time may be delayed. When the solution SOL in which the second alkali metal cation is dissolved is heated at the temperature exceeding about 500° C., the base glass substrate GP-P may be deformed or the heat resistant member TP may be damaged. As a result, the first portion GP-F1 may be exposed to the solution SOL in which the second alkali metal cation is dissolved Referring to the exemplary embodiment of FIG. 6C, since the first portion GP-F1 (e.g., top and bottom surfaces of the first portion GP-F1) is covered by the heat resistant member during the chemical reinforcing of the second portion GP-NF1 of the base glass substrate GP-P, the ion replacement does not occur. Therefore, as shown in the exemplary embodiment of FIG. 6D, a separate reinforced layer may not be formed on the first portion GP-F1, and a first reinforced layer FGP-NF1 may be formed on the surface of the second portion GP-NF1 exposed to the solution SOL in which the second alkali metal cation is dissolved. Thus, as shown in the exemplary embodiment of FIG. 6D, a reinforced non-folding portion GP-NF2 of a base glass substrate GP-Pt may include the first reinforced layer FGP-NF1 that is chemically reinforced and a first non-reinforced layer NGP-NF1 that is not chemically reinforced.

Figure 6E:
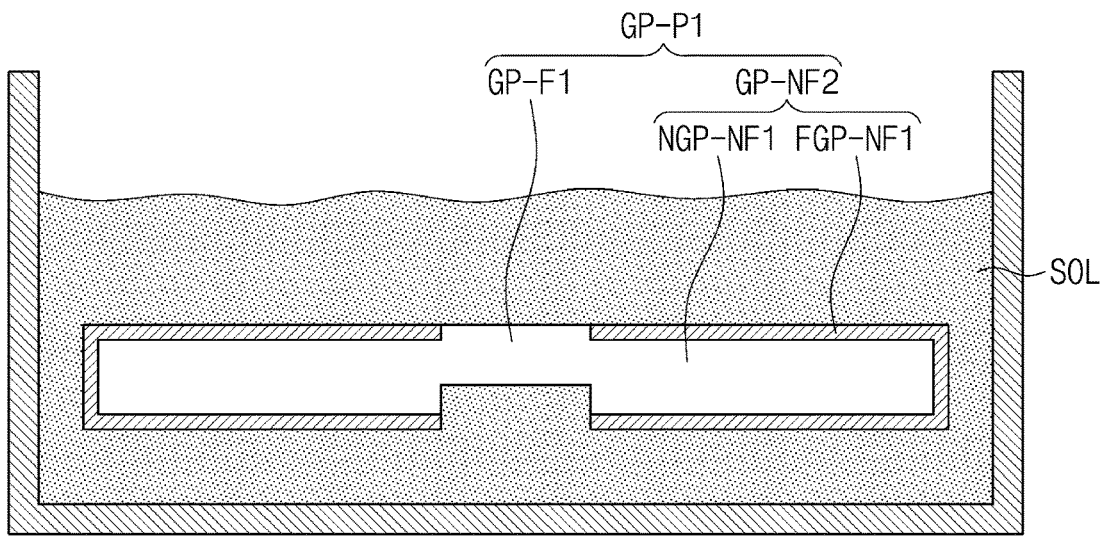
Figure 6E:
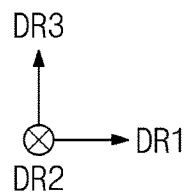
Figure 6F:
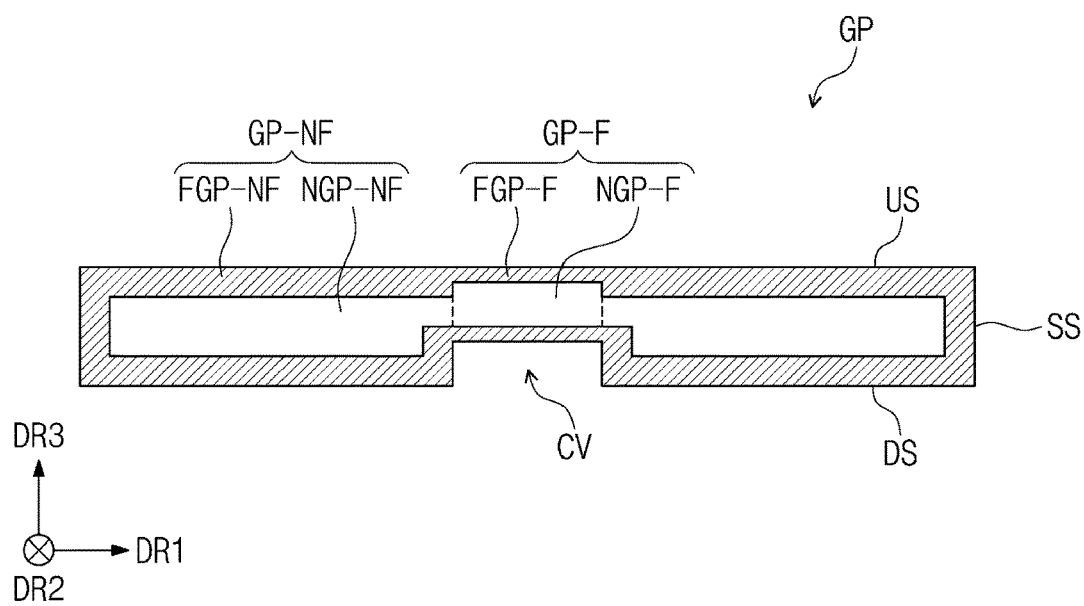

FIGS. 6E and 6F show the chemical reinforcing of the first portion GP-F1 and the reinforced non-folding portion GP-NF2 of the base glass substrate GP-P1.

Referring to the exemplary embodiment of FIG. 6E, the chemical reinforcing of the first portion GP-F1 and the reinforced non-folding portion GP-NF2 of the base glass substrate GP-P1 may be substantially the same as the above-described chemical reinforcing of the second portion GP-NF1 except that the covering of the first portion GP-F1 of the base glass substrate GP-P1 with the heat resistant member TP is omitted. Accordingly, detailed descriptions of the chemical reinforcing of the first portion GP-F1 and the reinforced non-folding portion GP-NF2 of the base glass substrate GP-P1 is omitted.

FIGS. 6A to 6E show the chemical reinforcing of the second portion GP-NF1 of the base glass substrate GP-P as the first chemical reinforcing operation and the chemical reinforcing of the first portion GP-F1 and the reinforced non-folding portion GP-NF2 of the base glass substrate GP-P as the second chemical reinforcing operation. However, exemplary embodiments of the present inventive concepts are not limited thereto. For example, the chemical reinforcing of the first portion GP-F1 and the second portion GP-NF1 of the base glass substrate GP-P may be performed as the first chemical reinforcing operation, and the chemical reinforcing of the reinforced non-folding portion GP-NF2 of the base glass substrate GP-P may be performed as the second chemical reinforcing operation.

FIG. 6F shows a cross-sectional view of the glass substrate GP formed by the manufacturing method of the glass substrate GP according to an exemplary embodiment of the present inventive concepts. Since the reinforced non-folding layer FGP-NF of the glass substrate GP is formed through two chemical reinforcing operations, the reinforced non-folding layer FGP-NF has a greater thickness than the reinforced folding layer FGP-F formed through one chemical reinforcing operation. Accordingly, the non-folding portion GP-NF of the glass substrate GP according to the exemplary embodiment may have an increased durability (e.g., a strong durability), and the folding portion GP-F may not be damaged even though the folding and unfolding operations are repeatedly performed.

The manufacturing method of the glass substrate according to an exemplary embodiment of the present inventive concepts may include the chemical reinforcement process of the folding portion of the base glass substrate and the chemical reinforcement process of the folding portion and the non-folding portion of the base glass substrate. Accordingly, the glass substrate manufactured by the manufacturing method of the present inventive concepts and the display device including the glass substrate may have an increased (e.g., strong) durability against external impact, and the folding and unfolding operations may be repeated without damaging the glass substrate.

Although exemplary embodiments of the present inventive concepts have been described, it is understood that the present inventive concepts should not be limited to these exemplary embodiments but various changes and modifications can be made by one ordinary skilled in the art within the spirit and scope of the present inventive concepts as hereinafter claimed.

What is claimed is:

1. A display device comprising:
   a display module comprising a folding area and a non-folding area adjacent to the folding area; and
   a glass substrate disposed on the display module and comprising a first layer and a second layer disposed on the first layer, the second layer having a compressive strength that is higher than a compressive strength of the first layer, the first layer and the second layer of the glass substrate each including:
     a folding portion overlapping the folding area and having a first thickness; and
     a non-folding portion overlapping the non-folding area and having a second thickness greater than the first thickness, wherein the second layer of the non-folding portion has a thickness that is greater than a thickness of the second layer of the folding portion.

2. The display device of claim 1, wherein the first thickness is in a range of about 10 micrometers to about 50 micrometers.

3. The display device of claim 1, wherein the second thickness is in a range of about 40 micrometers to about 100 micrometers.

4. The display device of claim 1, wherein the first layer comprises a first alkali metal cation, and the second layer comprises a second alkali metal cation having an ionic radius that is greater than an ionic radius of the first alkali metal cation.

5. The display device of claim 1, wherein the thickness of the second layer of the folding portion is in a range of about 20% to 50% of the thickness of the second layer of the non-folding portion.

6. The display device of claim 1, wherein each of the thickness of the second layer of the folding portion and the thickness of the second layer of the non-folding portion is uniform.

7. The display device of claim 1, wherein the first layer has an integral shape with the second layer.

8. The display device of claim 1, wherein the compressive strength of the second layer decreases as a distance from the first layer decreases.

9. The display device of claim 1, wherein the second layer covers the first layer.

10. The display device of claim 1, wherein the glass substrate comprises:
    a first surface disposed adjacent to the display module and provided with a concave portion defined therein to overlap the folding area; and
    a second surface exposed to an outside and being flat, wherein the first surface is connected to the second surface by a third surface.

11. The display device of claim 1, wherein the display module comprises:
    a display element layer;
    a thin film encapsulation layer encapsulating the display element layer; and
    an input sensing layer disposed directly on the thin film encapsulation layer.

12. A glass substrate comprising:
    a folding portion having a first thickness; and
    a non-folding portion disposed adjacent to the folding portion and having a second thickness that is greater than the first thickness, wherein the folding portion and the non-folding portion comprise a first layer and a second layer surrounding the first layer, the second layer having a compressive strength that is greater than a compressive strength of the first layer, a thickness of the second layer of the non-folding portion is greater than a thickness of the second layer of the folding portion.

13. The glass substrate of claim 12, wherein the first layer comprises a first alkali metal cation, and the second layer comprises a second alkali metal cation having an ionic radius that is greater than an ionic radius of the first alkali metal cation.

* * * * *